(12) United States Patent
Ting et al.

(10) Patent No.: US 11,233,003 B2
(45) Date of Patent: Jan. 25, 2022

(54) SURFACE MOUNT SEMICONDUCTOR DEVICE WITH A PLURALITY OF LEAD FRAMES

(71) Applicant: NEXPERIA B.V., Nijmegen (NL)

(72) Inventors: Christine Ting, Nijmegen (NL); Vegneswary Ramalingam, Nijmegen (NL); Melvin Hung, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 87 days.

(21) Appl. No.: 16/787,221

(22) Filed: Feb. 11, 2020

(65) Prior Publication Data
US 2020/0258829 A1  Aug. 13, 2020

(30) Foreign Application Priority Data

Feb. 11, 2019  (EP) ..................................... 19156433

(51) Int. Cl.
*H01L 23/495* (2006.01)
*H01L 23/48* (2006.01)
(Continued)

(52) U.S. Cl.
CPC .... *H01L 23/49838* (2013.01); *H01L 21/4846* (2013.01); *H01L 23/28* (2013.01);
(Continued)

(58) Field of Classification Search
CPC ......... H01L 23/49838; H01L 23/49551; H01L 23/495568; H01L 23/49861; H01L 23/3114; H01L 23/49537; H01L 23/3107; H01L 23/49541; H01L 21/4846; H01L 2924/181; H01L 23/49575; H01L 23/49555; H01L 23/28; H01L 23/49524; H01L 21/56

See application file for complete search history.

(56) References Cited

U.S. PATENT DOCUMENTS

| 2008/0054438 A1* | 3/2008 | Germain | ............. H01L 23/4334 257/690 |
| 2010/0019361 A1* | 1/2010 | Kummerl | .......... H01L 23/49537 257/675 |

(Continued)

OTHER PUBLICATIONS

European Search Report for corresponding application EP19156433.5 dated Aug. 5, 2019, 9 pages.

*Primary Examiner* — Alonzo Chambliss
(74) *Attorney, Agent, or Firm* — Ohlandt, Greeley, Ruggiero & Perle, LLP

(57) ABSTRACT

This disclosure relates to a semiconductor device and method of manufacture, including: a semiconductor die having a first major surface and a first contact terminal arranged thereon and an opposing second major surface having a second contact terminal arranged thereon and a first lead frame having first and second opposing major surfaces. The first major surface is fixedly attached to the first contact terminal of the semiconductor die. A second lead frame has first and second opposing major surfaces and the first major surface is fixedly attached to the second contact terminal of the semiconductor die. The first lead frame includes an integrally formed external contact portion extending from the first major surface thereof to a plane substantially co-planar with the second major surface of the second leadframe.

17 Claims, 4 Drawing Sheets

(51) Int. Cl.
  *H01L 21/00* (2006.01)
  *H05K 5/02* (2006.01)
  *H01L 23/498* (2006.01)
  *H01L 21/48* (2006.01)
  *H01L 23/31* (2006.01)
  *H01L 23/28* (2006.01)
  *H01L 21/56* (2006.01)

(52) U.S. Cl.
  CPC ...... *H01L 23/3107* (2013.01); *H01L 23/3114* (2013.01); *H01L 23/49524* (2013.01); *H01L 23/49537* (2013.01); *H01L 23/49541* (2013.01); *H01L 23/49551* (2013.01); *H01L 23/49555* (2013.01); *H01L 23/49568* (2013.01); *H01L 23/49575* (2013.01); *H01L 23/49861* (2013.01); *H01L 21/56* (2013.01)

(56) References Cited

U.S. PATENT DOCUMENTS

2015/0221581 A1   8/2015   Tamura
2015/0279757 A1   10/2015   Tan et al.

\* cited by examiner

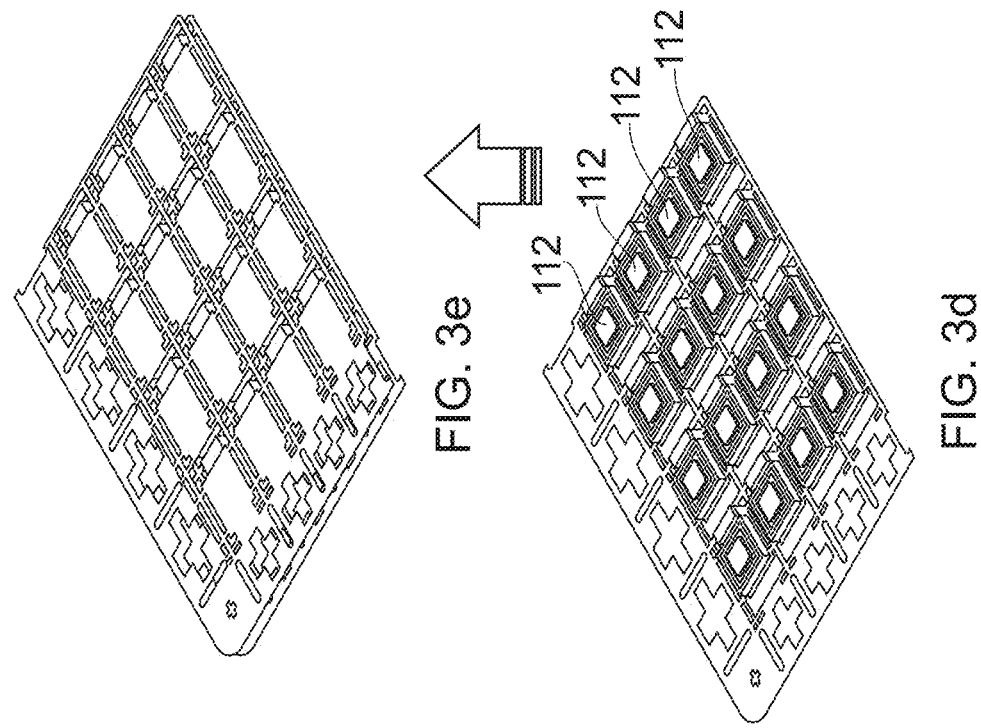
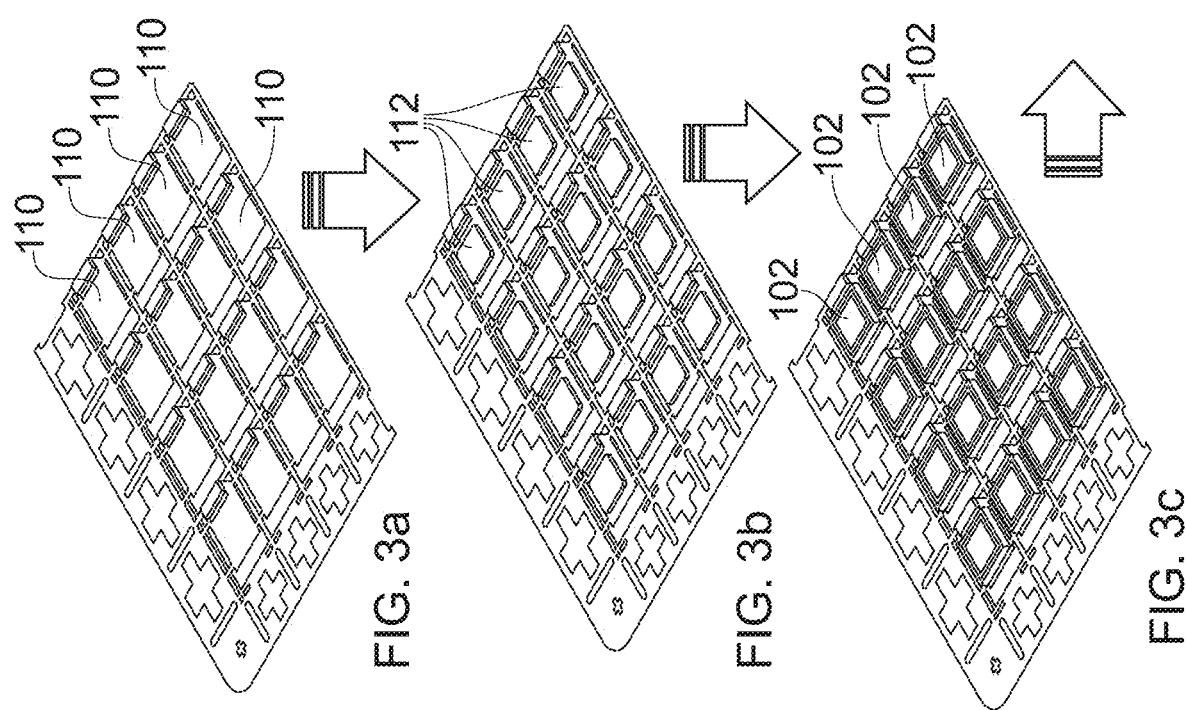

SURFACE MOUNT SEMICONDUCTOR DEVICE WITH A PLURALITY OF LEAD FRAMES

CROSS REFERENCE TO RELATED APPLICATION

This application claims the benefit under 35 U.S.C. § 119(a) of European Application No. 19156433.5 filed Feb. 11, 2019 the contents of which are incorporated by reference herein in their entirety.

BACKGROUND OF THE DISCLOSURE

1. Field of the Disclosure

The present disclosure relates to a surface mount semiconductor device and to a method of manufacturing a surface mount semiconductor device. In particular, this disclosure relates to a lead-less surface mount semiconductor device and associated method of manufacture.

2. Description of the Related Art

Semiconductor devices are capable of being mounted or placed directly onto the surface of a carrier such as a printed circuit board (PCB). Such semiconductor devices are known surface-mount devices (SMD). Using SMDs allows increased speed of producing completed electronic circuits formed on a PCB by using automated pick and place techniques thus reducing the manufacturing time of PCB mounted electronic circuits.

SMDs can be arranged in various package formats such as lead-less Dual Flat No-Lead (DFN), Quad Flat No-Lead (QFN) packages and so on. QFN and DFN packages are commonly used for discrete devices due to the small footprint and the small package height. Where such lead-less package formats incorporate power semiconductor dies, for example, thermal dissipation from the from the semiconductor die is an important design consideration to prevent the die from overheating. Devices such as transient voltage suppression (TVS) protection devices are used for protecting integrated circuits (ICs) against electrical overstress. In use, these devices are connected between an external input and the input of an IC, and can operate to drain unwanted currents to ground or another rail so that any internally provided protection of the IC is not overstressed and damaged.

The heat caused by the current within the protection device can limit the robustness of the device. The temperature within the protection device is dependent on factors such as the dissipated power, the thermal capacity of the device and the thermal resistance of the device.

So called Dual Cool™ device package formats are available which provide both bottom- and top-side cooling to the semiconductor die by way of heatsinks which are exposed at the top and bottom side of the device package.

However, there are a number of design and manufacturing challenges to achieve exposed heats. Most notable is accurate control of the adhesive bond attaching the semiconductor die to the respective heat sinks. If there is any variation in bond thickness along the length of the bond, known as bond line thickness, this will result in a heatsink which is tilted with respect to the semiconductor die on which it is mounted. During the moulding of the semiconductor die, tilted heatsinks can cause moulding compound flashes which at least partially cover the portion of the heatsink which should otherwise have been exposed. This can reduce thermal dissipation from the die.

SUMMARY

Various example embodiments are directed to issues such as those addressed above and/or others which may become apparent from the following disclosure concerning improving assembly processes to achieve semiconductor devices having top and bottom side exposed heat sinks.

In certain example embodiments, aspects of the present disclosure involve semiconductor devices comprising top and bottom side exposed heat sinks attached to contact terminals on respective top and bottom side of the semiconductor die.

According to an embodiment there is provided a semiconductor device, comprising: a semiconductor die wherein the semiconductor die comprises a first major surface having a first contact terminal arranged thereon and an opposing second major having a second contact terminal arranged thereon; a first lead frame having first and second opposing major surfaces wherein the first major surface is fixedly attached to the first contact terminal of the semiconductor die; a second lead frame having first and second opposing major surfaces wherein the first major surface is fixedly attached to the second contact terminal of the semiconductor die; and wherein the first lead frame comprises an integrally formed external contact portion extending from the first major surface thereof to a plane substantially co-planar with the second major surface of the second leadframe.

According to another embodiment there is provided a method of manufacturing a semiconductor device; the method comprising: providing a semiconductor die wherein the semiconductor die comprises a first major surface having a first contact terminal arranged thereon and an opposing second major having a second contact terminal arranged thereon; providing a first lead frame having first and second opposing major surfaces wherein the first major surface is fixedly attached to the first contact terminal of the semiconductor die; providing a second lead frame having first and second opposing major surfaces wherein the first major surface is fixedly attached to the second contact terminal of the semiconductor die; wherein the first lead frame comprises an integrally formed external contact portion extending from the first major surface thereof to a plane substantially co-planar with the second major surface of the second leadframe.

The semiconductor device may comprise a mould material configured and arranged to encapsulate the semiconductor die. The first and second lead frames may be respective first and second heat sinks configured and arranged such that respective second major surfaces are exposed through the mould material at respective first and second major surfaces of the semiconductor device.

The second major surface of the first lead frame may be substantially co-planar with the mould material at the first major surfaces of the semiconductor device.

The integrally formed external contact portion of the first lead frame may extend along a length of a side wall from the first to the second major surfaces of the semiconductor device.

The second lead frame may comprise an integrally formed external contact portion which may extend partially along a length a side wall from the second major surface towards the first major surface of the semiconductor device.

The integrally formed external contact portions may be arranged as contact portions configured and arranged to be fixedly mounted to a carrier surface. The length of the external contact portion of the first lead frame may be greater than the length of the external contact portion of the second lead frame. The first and second lead frames, may each be substantially L-shaped in cross-section.

A first layer of conductive adhesive may be arranged between the first contact terminal and the first major surface of the first lead frame; and a second layer of conductive adhesive may be arranged between the second contact terminal and the first major surface of the second lead frame.

A thickness of the first layer of conductive adhesive may be consistent over a contact area between the first contact terminal and the first major surface of the first lead frame, and a thickness of the second layer of conductive adhesive may be consistent over a contact area between the second contact terminal and the first major surface of the second lead frame.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIGS. 3a to 3i illustrate example process steps for the manufacture of packaged semiconductor die according to embodiments.

DETAILED DESCRIPTION

Figure 1:
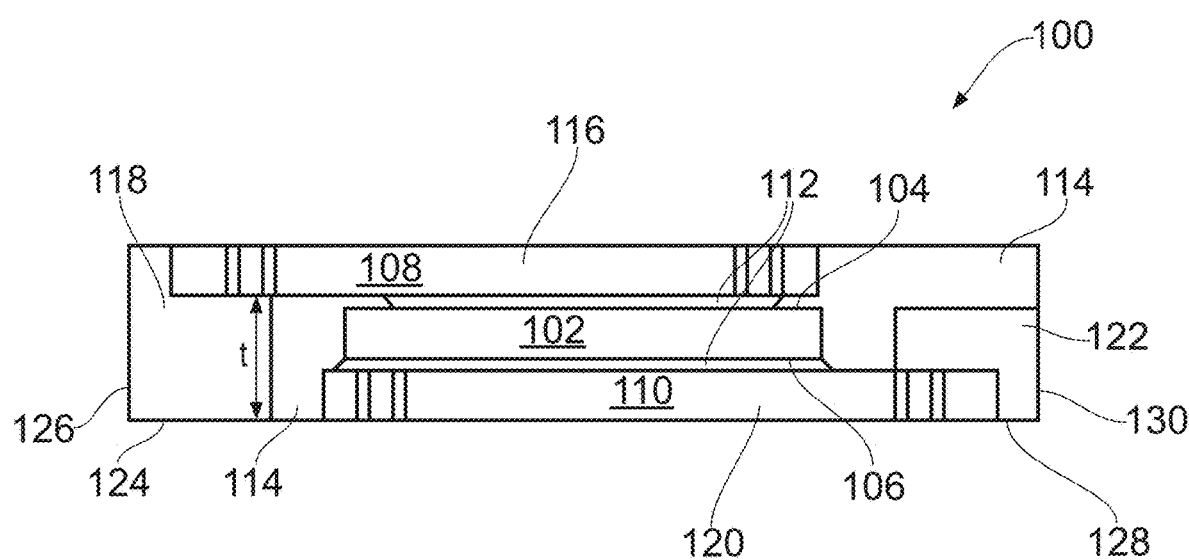
FIG. 1 illustrates a cross-section of semiconductor device according to an embodiment.

FIG. 1 illustrates a cross-section of a leadless semiconductor device 100 according to an embodiment. The semiconductor device 100 comprises a semiconductor die 102. A first contact terminal 104 is provided on a first major surface of the semiconductor die 102 and a second contact terminal 106 is provided on a second major surface, opposite the first major surface, of the semiconductor die 102. The first contact terminal 104 of the semiconductor die 102 is fixedly and electrically attached to a first leadframe 108, and the second contact terminal of the semiconductor die 102 is fixedly and electrically attached to a second leadframe 110. The first and second contacts 104, 106 of the semiconductor die 102 are attached to the respective first and second leadframes 108, 110 by an electrically conductive adhesive 112 forming adhesive bond lines at respective contact terminals 104, 106 leadframe 108, 110 interfaces. In this way, the first and second lead frames 108, 110 provide mechanical support for the semiconductor die 102, whilst also making electrical connections to the first and second contact terminals 104, 106.

The first lead frame 108 and second leadframe 110 are arranged as electrically conductive heat sinks and may be formed of a metallic material, for instance, they may comprise an electrically conductive metal such as copper. The first lead frame 108 comprises a planar semiconductor die attach portion 116 for electrically and mechanically attaching the first contact terminal 104 of the semiconductor die 102 thereto (as discussed above). In this way the semiconductor die attach portion 116 extends substantially parallel to a plane containing first contact terminal 104 of the semiconductor die 102.

The first lead frame 108 further comprises an external connection portion 118 which is integrally formed with the die attach portion 116. The external connection portion 118 extends away from the die attach portion 116. The external connection portion 118 may extend in a direction substantially orthogonal to the die attach portion 116. As illustrated in FIG. 1, the external connection portion 118 extends downward from the die attach portion 116 past the semiconductor die 102.

Likewise, the second lead frame 110 comprises a semiconductor die attach portion 120 for electrically and mechanically attaching the second contact terminal 106 of the semiconductor die 102 thereto. In this way the semiconductor die attach portion 120 extends substantially parallel to a plane containing second contact terminal 106 of the semiconductor die 102.

The second lead frame 110 further comprises an external connection portion 122 which is integrally formed with the die attach portion 120. The external connection portion 122 extends away from the die attach portion 120. The external connection portion 122 may extend in a direction substantially orthogonal to the die attach portion 120. As illustrated in FIG. 1, the external connection portion 118 extends upward from the die attach portion 120 to a side of the semiconductor die 102.

The electrical connection portion 118 of the first lead frame 108, as it extends from the die attach portion 116, has a thickness t which corresponds to the thickness of the die attach portion 120 of the second lead frame 110, the thickness of the die 102, and the combined adhesive bond lines at respective contact terminals 104, 106 of the semiconductor die 102. In this way the first lead frame can be seen to be L-shaped in cross-section.

The electrical connection portion 122 of the second lead frame 108, as it extends from the die attach portion 116, has a thickness less than t of the electrical connection portion 118 of the first lead frame 108. Similar to the first lead frame 108, the second lead frame 110 can also be seen to be L-shaped in cross-section.

The first lead frame 108 is configured to conduct electrical current to/from the semiconductor die 102 and the electrical connection portion 118 of the first lead frame 108. The electrical connection portion 118 is also configured such that it may be surface mounted on electrical contacts of a carrier such as a printed circuit board (not illustrated). In this regard, the electrical connection portion 118 comprises a bottom contact surface 124, and a side contact surface 126. The bottom and side contact surfaces 124, 126 are configured such that they are solderable to the electrical contacts of the carrier. When the semiconductor device 100 is soldered or glued to a carrier, a solder/glue joint meniscus may extend from the respective electrical contact of the carrier up the contact surface 126. The solder/glue joint will also extend across the area of bottom contact surface 124 above the electrical contact of the carrier.

Likewise, the second lead frame 110 is also configured to conduct current to/from the semiconductor die 102. The electrical connection portion 122 of the second lead frame 110 also comprises a bottom contact surface 128, and a side contact surface 130. The bottom and side contact surfaces 128, 130 are configured such that they are solderable to the electrical contacts of a carrier in the same way as the bottom and side contact surfaces 124, 126 of the first lead frame 108.

According to embodiments, a mould material (or encapsulation) 114 is arranged to encapsulate the semiconductor die 102 following attachment of the contact terminals 104, 106 to the respective first and second lead frames 108, 110.

The above described arrangement allows for solder joints connecting electrical connection portions 118, 122 of the lead-less semiconductor device according to embodiments to be visually inspected, by for example Automatic Optical Inspection (AOI) to check for solder joint coverage post-solder reflow processing.

The contact surface of the 124 of the first lead frame 108 is arranged to be substantially coplanar with the contact surface 128 of the second leadframe 110. Furthermore, the contact surface of the 124 of the first lead frame 108 and the contact surface 128 of the second leadframe 110 are planar across their respective surface areas. Moreover, by accurate dispense of the electrically conductive adhesive 112, by for example stencil printing, prevents tilting of the semiconductor die 102 with respect to the first 108 and second 110 lead frames.

Figure 2B:
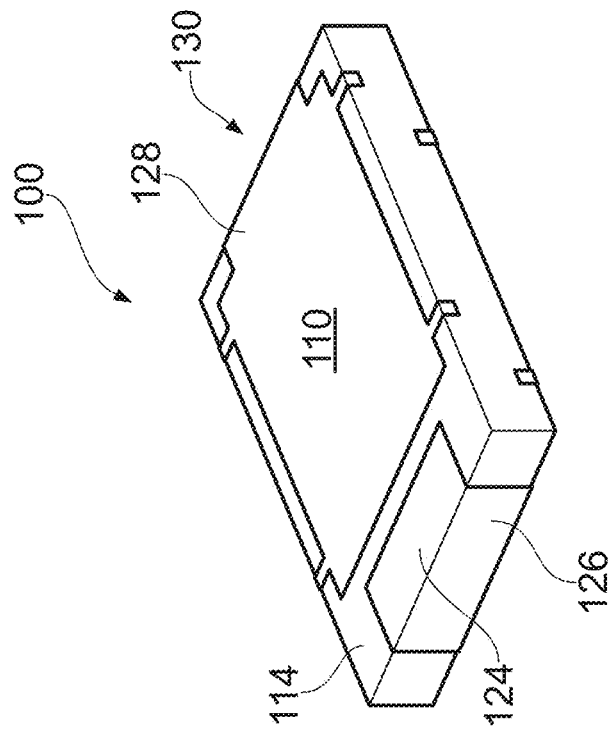
FIG. 2b illustrates an isometric view of a second side of a packaged semiconductor device according to an embodiment.
Figure 2A:
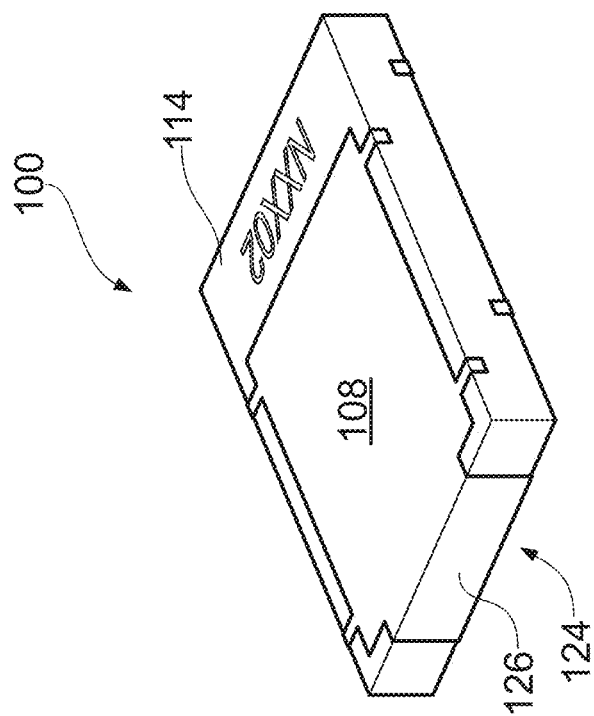
FIG. 2a illustrates an isometric view of a first side of a packaged semiconductor device according to an embodiment.

As illustrated in FIG. 1, and FIGS. 2a and 2b, the mould material (or encapsulation) 114 extends partially over the top and bottom major surfaces of the lead-less semiconductor device 100. FIG. 2a shows that the mould material 114 partially covers and comprises a portion of the top major surface of the semiconductor device 100. The remaining portion of the top major surface comprises an exposed upper surface of the die attach portion 116 of the first lead frame 108. The exposed surface of the die attach portion 116 is obverse the side to which the semiconductor die is attached. Likewise, FIG. 2b shows that the mould material 114 partially covers and comprises a portion of the bottom major surface of the semiconductor device 100. The remaining portion of the bottom major surface comprises an exposed lower surface of the die attach portion 120 of the second lead frame 110. The exposed surface of the die attach portion 120 is obverse the side to which the semiconductor die is attached. This arrangement of exposed surfaces of the first lead frame 108 and the second lead frame 110 provides improved thermal dissipation of heat generated in the semiconductor die 102 during operation, whilst also allowing for electrical connection of the semiconductor device 100 to a carrier. The semiconductor device 100 is fixedly mounted and connected to the carrier by, for example, soldering the bottom contact surface 128, and a side contact surface 130 of the second lead frame to a corresponding connection on the carrier. Likewise, the bottom and side contact surfaces 124, 126 of the first lead frame may be fixedly connected to a corresponding connection on the carrier. The side contact surface 130 of the second lead frame, as illustrated in FIG. 1 extends partially upward on a side wall of the semiconductor device. This can be seen in FIG. 2a which shows an absence bottom surface contact corresponding to the side contact surface 130 of the second lead frame.

The exposed arrangement of the die attach portions 116, 120 through the mould material provide for improved heat dissipation whilst maintaining consistent bond line thickness across the area of the adhesive bond lines connecting the die attach portions of the respective first and second lead frames to the respective contact terminals 104, 106 of the semiconductor die 102.

FIGS. 3a to 3i show an example process steps for a method of making a semiconductor device according to an embodiment. The method can allow for a plurality of devices to be made.

In a first step, as illustrated in FIG. 3a, the method involves providing a plurality of connected second lead frames 110 arranged as a matrix. The second lead frames 110 are be suitably dimensioned for mounting a semiconductor die thereon. As illustrated in FIG. 3b, a suitable electrically conductive die attach material 112 is then provided on the second lead frames 110. The electrically conductive die attach material 112 may be a solder or conductive adhesive and may be dispensed on the second lead frames 110 by, for example stencil printing. The electrically conductive die attach material 112 allows for the electrical and mechanical of connection second contact terminal 106 of the semiconductor dies 102 to the second lead frames 110. As illustrated in FIG. 3c, the semiconductor dies are then placed on the conductive die attach material 112 arranged on the second lead frames 110.

Following placement of the semiconductor dies 102 on the second lead frames 110 a further electrically conductive die attach material 112 is then provided by, for example stencil printing, on the first contact terminals 104 of the semiconductor dies 102 as illustrated in FIG. 3d. The further electrically conductive die attach material 112 may be the same material as used in the die attach step discussed above with respect to FIG. 3c and may be printed using a similar method.

Following the dispensing of the conductive die attach material 112, as discussed with reference to FIG. 3c, the first lead frames 108 are then mounted on the semiconductor die as shown in FIG. 3e. The arrangement as assembled in FIG. 3e, is then placed within a clamp shell (not illustrated). The clamp shell may comprise a top portion which contacts the first lead frame 108, and a bottom portion which contacts the second lead frame 110. Locator or guide pins may be arranged on the top or bottom clamp, with corresponding holes on the first lead frames 108 and second lead frames 110, for receiving the locator pins, arranged on the top or bottom clamp. This holds the clamp in place prevents the lead frames, top and bottom portions of the clamp from becoming skewed during the reflow process. The clamping process also assist in maintaining the consistent bond line thickness mentioned above. The clamping process may be suitable for bulk bonding technique.

The arrangement, as formed thus far, may then undergo solder reflow to make the electrical and mechanical connection of the lead frames 108, 110 to the respective contact terminals 104, 106 of the semiconductor dies 102. Where the conductive die attach material 112 is an adhesive, the reflow process may be an adhesive curing process. As with the arrangement of the of second lead frames 110, the first lead frames 108 may also be arranged as a matrix. The first lead frames 108 are be suitably dimensioned for mounting to the semiconductor die 102.

Figure 3I:
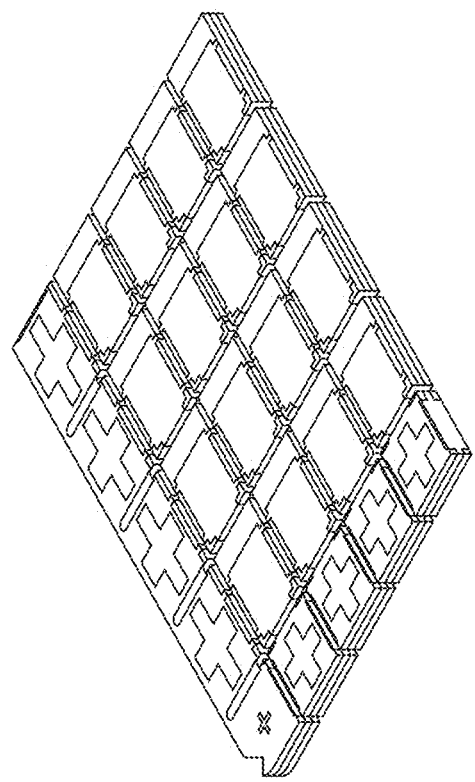
Figure 3H:
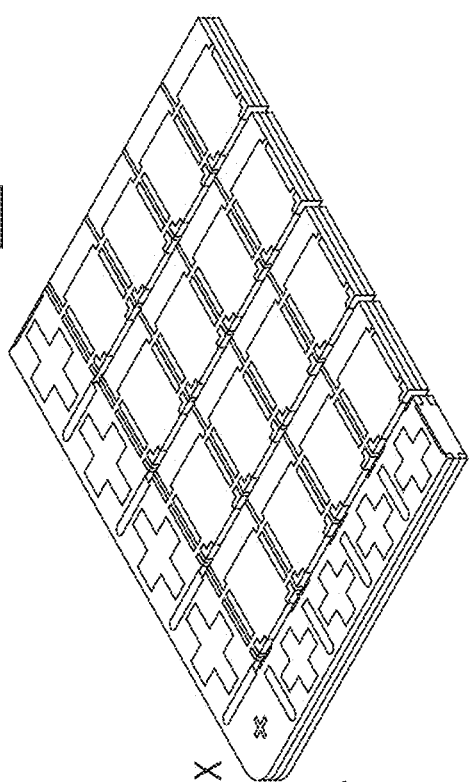
Figure 3F:
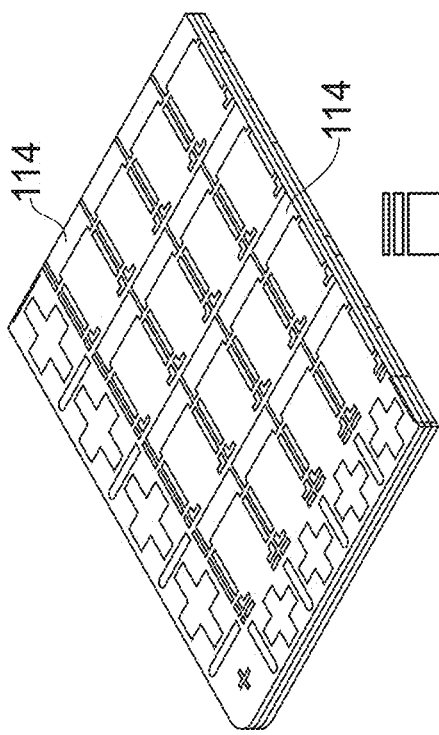
Figure 3G:
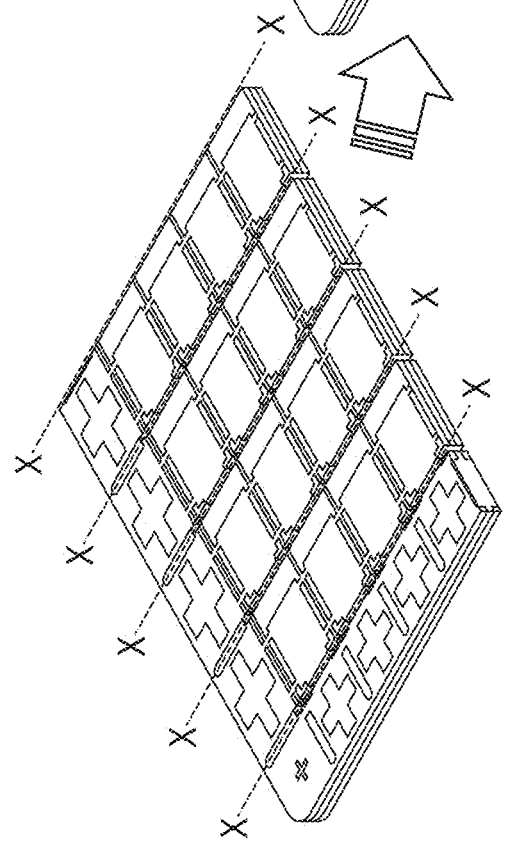

The process then continues at FIG. 3f, where the arrangement undergoes encapsulation (or moulding) in an encapsulant 114 which fills the space around the substrates around the semiconductor die 102. The encapsulation process may be any suitable process such as mould mapping with film assisted moulding (FAM) provided that it results in the exposed surfaces of the lead frames as described above with respect to FIG. 1.

Following the encapsulation process, the matrix arrangement undergoes a first series of cuts (indicated by lines x-x) along the side wall of the devices to expose the side contact surfaces 126, 130 of the first and second lead frames 108, 110. This exposure of the side contact surfaces 126, 130 allows for plating of the contact surfaces in FIG. 3h.

Following plating, the matrix arrangement undergoes a second series of cuts, orthogonal to the first series of cuts, to singulate the semiconductor devices 100 according to embodiments and thus arriving at the individual device as shown in FIGS. 1, 2a and 2b.

Based on the above disclosure, the skilled person will see that the semiconductor device according to embodiments provides exposed heat sink portions on both sides of the device, whilst also allowing for soldering to a carrier such as PCB in which the solder joint is visible from the sides of the device.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. A leadless semiconductor device, comprising:
a semiconductor die, wherein the semiconductor die comprises a first major surface having a first contact terminal arranged thereon and an opposing second major surface having a second contact terminal arranged thereon;
a first lead frame having first and second opposing major surfaces, wherein the first major surface of the first lead frame is fixedly attached to the first contact terminal of the semiconductor die;
a second lead frame having first and second opposing major surfaces, wherein the first major surface of the second lead frame is fixedly attached to the second contact terminal of the semiconductor die; wherein the first lead frame comprises an integrally formed external contact portion extending from the first major surface thereof to a plane substantially co-planar with the second major surface of the second leadframe: and
wherein the second lead frame comprises an integrally formed external contact portion that extends partially along a length of a side wall of the leadless semiconductor from the second major surface towards the first major surface of the semiconductor device.

2. The semiconductor device of claim 1, further comprising a mould material configured and arranged to encapsulate the semiconductor die.

3. The semiconductor device of claim 2, wherein the first and second lead frames are respective first and second heat sinks configured and arranged so that the respective second major surfaces are exposed through the mould material at respective first and second major surfaces of the semiconductor device.

4. The semiconductor device of claim 3, wherein the second major surface of the first lead frame is substantially co-planar with the mould material at the first major surfaces of the semiconductor device.

5. The semiconductor device of claim 3, wherein the second major surface of the second lead frame is substantially co-planar with the mould material at the second major surface of the semiconductor device.

6. The semiconductor device of claim 2, wherein the second major surface of the first lead frame is substantially co-planar with the mould material at the first major surfaces of the semiconductor device.

7. The semiconductor device of claim 2, wherein the second major surface of the second lead frame is substantially co-planar with the mould material at the second major surface of the semiconductor device.

8. The semiconductor device of claim 1, wherein the integrally formed external contact portion of the first lead frame extends along a length of a side wall from the first to the second major surfaces of the semiconductor device.

9. The semiconductor device of claim 1, wherein the integrally formed external contact portion of the first lead frame extends along a length of a side wall from the first to the second major surfaces of the semiconductor device;
wherein the second lead frame comprises an integrally formed external contact portion that extends partially along a length of a side wall from the second major surface towards the first major surface of the semiconductor device; and
wherein the integrally formed external contact portions are arranged as contact portions configured and arranged to be fixedly mounted to a carrier surface.

10. The semiconductor device of claim 9, wherein the length of the external contact portion of the first lead frame is greater than the length of the external contact portion of the second lead frame.

11. The semiconductor device of claim 1, wherein the first and second lead frames are substantially L -shaped in cross-section.

12. The semiconductor device of claim 1, further comprising: a first layer of conductive adhesive arranged between the first contact terminal and the first major surface of the first lead frame; and a second layer of conductive adhesive arranged between the second contact terminal and the first major surface of the second lead frame.

13. The semiconductor device of claim 12, wherein the first layer of conductive adhesive has a thickness of that is consistent over a contact area between the first contact terminal and the first major surface of the first lead frame, and the second layer of conductive adhesive has a thickness of that is consistent over a contact area between the second contact terminal and the first major surface of the second lead frame.

14. A method of manufacturing a leadless semiconductor device;

the method comprising:

providing a semiconductor die, wherein the semiconductor die comprises a first major surface having a first contact terminal arranged thereon and an opposing second major having a second contact terminal arranged thereon;

providing a first lead frame having first and second opposing major surfaces, wherein the first major surface of the first lead frame is fixedly attached to the first contact terminal of the semiconductor die;

providing a second lead frame having first and second opposing major surfaces, wherein the first major surface of the second lead frame is fixedly attached to the second contact terminal of the semiconductor die;

wherein the first lead frame comprises an integrally formed external contact portion extending from the first major surface thereof to a plane substantially co-planar with the second major surface of the second leadframe; and wherein the second lead frame comprises an integrally formed external contact portion that extends partially along a length of a side wall of the leadless semiconductor from the second major surface towards the first major surface of the semiconductor device.

15. The method of claim 14, wherein the first and second lead frames are respective first and second heat sinks and are provided such that the respective second major surfaces are exposed through a mould material at respective first and second major surfaces of the semiconductor device.

16. The method of claim 15, wherein the second major surface of the first lead frame is provided to be substantially co-planar with the mould material at the first major surfaces of the semiconductor device.

17. The method of claim 14, wherein the second major surface of the first lead frame is provided to be substantially co-planar with the mould material at the first major surfaces of the semiconductor device.

\* \* \* \* \*